United States Patent
Yoon

(10) Patent No.: US 6,834,015 B2
(45) Date of Patent: Dec. 21, 2004

(54) SEMICONDUCTOR MEMORY DEVICE FOR REDUCING DATA ACCESSING TIME

(75) Inventor: Young-Jin Yoon, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/621,246

(22) Filed: Jul. 15, 2003

(65) Prior Publication Data

US 2004/0125664 A1 Jul. 1, 2004

(30) Foreign Application Priority Data

Dec. 30, 2002 (KR) .................................... 2002-0086466

(51) Int. Cl.[7] .............................................. G11C 7/00
(52) U.S. Cl. ............................ 365/189.05; 365/189.02; 365/191
(58) Field of Search ....................... 365/189.02, 189.05, 365/191, 233

(56) References Cited

U.S. PATENT DOCUMENTS

| | | | |
|---|---|---|---|
| 5,544,124 A | | 8/1996 | Zagar et al. |
| 5,713,005 A | * | 1/1998 | Proebsting .................. 713/600 |
| 6,094,380 A | * | 7/2000 | Kim ............................ 365/194 |
| 6,192,005 B1 | * | 2/2001 | Lee ............................. 365/233 |
| 6,243,302 B1 | | 6/2001 | Yoon et al. |
| 6,288,947 B1 | | 9/2001 | Kim et al. |
| 6,539,454 B2 | * | 3/2003 | Mes ............................ 365/233 |
| 2003/0058696 A1 | | 3/2003 | Han et al. |

FOREIGN PATENT DOCUMENTS

| | | |
|---|---|---|
| JP | 04-239605 | 9/1992 |
| JP | 2000-193821 | 6/2000 |
| JP | 2001-165453 | 5/2001 |

* cited by examiner

*Primary Examiner*—Son Mai
(74) *Attorney, Agent, or Firm*—Blakely Sokoloff Taylor & Zafman

(57) ABSTRACT

A semiconductor memory device minimizes a data accessing time. For the purpose, it includes a first control signal generator for producing a first control signal by logically combining a pipelatch-in signal and a start-odd start-even data output control signal, a second control signal generator for producing an odd control signal by logically combining an odd data enable signal for outputting odd-numbered data and a control signal for accessing the odd-numbered data in response to a start address, and generating an even control signal by logically combining an even data enable signal for outputting even-numbered data and a control signal for accessing the even-numbered data in response to the start address, a first accessing unit for accessing input data in response to the first control signal, a latch for temporarily storing data outputted from the first data accessing unit, and a second accessing unit for secondly accessing the data stored at the latch, thereby outputting secondly accessed data.

8 Claims, 8 Drawing Sheets

|  | A:"H"<br>B:don't care | A:"L"<br>B:"H" | A:"L"<br>B:"L" |
|---|---|---|---|
| out | High | Low | High |
| outb | High | High | Low |

SEMICONDUCTOR MEMORY DEVICE FOR REDUCING DATA ACCESSING TIME

FIELD OF THE INVENTION

The present invention relates to a semiconductor memory device; and, more particularly, to a semiconductor memory device capable of minimizing a time required in accessing 4 bit data pre-fetched at a pipelatch.

DESCRIPTION OF RELATED ART

A 2-bit pre-fetch scheme has been employed in a conventional semiconductor memory device and, recently, the use of a 4-bit pre-fetch scheme is being considered. In the 2-bit pre-fetch scheme, two data are simultaneously read out through different buses in response to one read instruction and stored at a pipelatch. Then, at a data output mode, the two data are outputted at a rising edge and a falling edge of a clock pulse, respectively. When reading out the two data, the two data can be read out in series or in parallel.

FIG. 1 provides a block diagram of a pipelatch unit 110 and an output driver 130 of a conventional semiconductor memory device.

In the conventional semiconductor memory device performing the 4-bit pre-fetch, 4 serial data inputs are loaded onto 4 global input/output lines (GIO) in response to one read instruction.

The pipelatch unit 110 of the conventional semiconductor memory device consists of 4 pipelatches, pipelatch<0:3>, and receives data on multiplexer output lines, mxoutb, which are in a stand-by state at the outside of the pipelatch unit 110, when pipelatch-in signals, Pin<0:3>, are transited to a low state "L". Whether or not allowing data to be coupled into the pipelatch unit 110 is determined by the pipelatch-in signals, Pin<0:3>.

In accordance with the conventional technology, the data on the multiplexer output lines, mxoutb, are accessed four times when they pass the pipelatch unit 110 and accessed one time at the output driver 130. That is, the data read out from a bank are accessed totally 5 times until being outputted to the outside of the semiconductor memory device.

At first, the above data are fed into one of the pipelatch<0:3> under the control of the pipelatch-in signals, Pin<0:3>. Secondly, they are accessed in response to a start-odd start-even data output control signal, isoseb0_do. Thirdly, they are accessed under the control of a signal, isoseb1_rd, which accesss odd-numbered data in response to a start address and a signal, isoseb1_fd, which accesss even-numbered data in response to the start address. Fourthly, the data stored at the pipelatch<0:3> are coupled onto a rising edge output line, rdo, and a falling edge output line, fdo, in response to output control signals, rpout and fpout, so that the data stored at the pipelatch<0:3> are provided to the output driver 130 and then outputted to the outside at the output driver 130 under the control of a rising edge signal, fclk_do, or a falling edge signal, fclk_do, of a clock pulse.

Herein, the start-odd start-even data output control signal, isoseb0_do, is a control signal for accessing the data inputted to the pipelatch unit 110 according to whether or not the start address is an odd number or an even number.

In FIGS. 2A and 2B, there are described detailed circuit diagrams of a first-type and a second-type transmission gate shown in FIG. 1, respectively. Since the skilled person in the art can analyze the circuits by using the circuit diagrams described in FIGS. 2A and 2B, the detailed explanation for the circuits are omitted.

FIG. 3 shows a waveform diagram of simulation results at a first and a second accessing part in the pipelatch described in FIG. 1.

The conventional pipelatch receives data on the multiplexer output lines, mxoutb, when the pipelatch-in signal, Pin, is in a "L" state, and then doesn't receive external data anymore if the pipelatch-in signal, Pin, is transited to a "H" state. That is, it is noted that the pipelatch provides the data onto a pre-rising edge output line, pre_rdo, or a pre-falling edge output line, pre_fdo, by multiplexing the data according to whether the start address is an even number or an odd number by using the start-odd start-even data output control signal, isoseb0_do.

FIG. 4 is a waveform diagram representing simulation results at parts for the accessing of odd-numbered data in the pipelatch and the output driver of FIG. 1.

In case the start address is 0, a first data on a first pre-rising edge output line, pre_rdo<0>, of the pipelatch 110 is provided onto the rising edge output line, rdo, and the output driver 130 outputs the first data on the rising edge output line, rdo, during a rising edge, rclk_do, of a first clock pulse. Then, by the toggle of the signal, isoseb1_rd, for accessing odd data according to what the start address is, a third data on a second pre-rising edge output line, pre_rdo<1>, is fed to the rising edge output line, rdo, and the output driver 130 outputs the third data on the rising edge output line, rdo, during a rising edge, rclk_do, of a second clock pulse.

FIG. 5 provides a waveform diagram representing simulation results at parts for the accessing of even-numbered data in the pipelatch and the output driver of FIG. 1.

In case the start address is 0, a second data on a first pre-falling edge output line, pre_fdo<0>, of the pipelatch 110 is fed onto the falling edge output line, fdo, and the output driver 130 outputs the second data on the falling edge output line, fdo, during a falling edge, fclk_do, of the first clock pulse. Then, by the toggle of the signal, isoseb1_fd, for accessing even data according to what the start address is, a fourth data on a second pre-falling edge output line, pre_fdo<1>, is coupled to the falling edge output line, rdo, and the output driver 130 outputs the fourth data on the falling edge output line, fdo, during a falling edge, fclk_do, of the second clock pulse.

That is to say, according to the conventional art, the data on the multiplexer output line, mxoutb, are accessed 4 times during they are passing the pipelatch unit 110 and accessed one time at the output driver 130. As a result, the data are totally accessed 5 times.

However, when accessing data 5 times at the pipelatch and the output driver, there occurs a problem of a data delay time lengthened. Namely, whenever accessing data, there is required a margin. For example, when allotting a margin of 300 ps for one-time accessing, a time of 1.5 ns is consumed for the five-time accessing. Further, since an address access time, tAA, includes the time required for data to pass the pipelatch, the address access time also becomes longer.

SUMMARY OF THE INVENTION

It is, therefore, an object of the present invention to provide a semiconductor memory device capable of minimizing a time required in accessing data at a pipelatch and an output driver.

In accordance with one aspect of the present invention, there is provided a semiconductor memory device capable of minimizing a data accessing time, comprising: a first control signal generation unit for outputting a first control signal generated by logically combining a pipelatch-in signal and a start-odd start-even data output control signal; a second control signal generation unit for outputting an odd control signal generated by logically combining an odd data enable signal for outputting odd-numbered data and a control signal for accessing the odd-numbered data in response to a start address, and outputting an even control signal produced by logically combining an even data enable signal for outputting even-numbered data and a control signal for accessing the even-numbered data in response to the start address; a first data accessing unit for accessing inputted data under the control of the first control signal outputted from the first control signal generation unit; a latch for temporarily storing data outputted from the first data accessing unit; and a second data accessing unit for secondly accessing the data stored at the latch and outputting secondly accessed data.

In accordance with another aspect of the present invention, the first control signal generation unit includes: an inverter receiving the pipelatch-in signal; a first NAND gate receiving an output of the inverter and the start-odd start-even data output control signal to thereby output a piseso signal; and a second NAND gate receiving the output of the inverter and an output of the first NAND gate to thereby output a pisose signal.

In accordance with another aspect of the present invention, the second control signal generation unit includes: an odd data accessing control signal producing sector for outputting the odd control signal generated by logically combining the odd data enable signal for outputting the odd-numbered data and the control signal for accessing the odd-numbered data in response to the start address; and an even data accessing control signal producing sector for outputting the even control signal created by logically combining the even data enable signal for outputting the even-numbered data and the control signal for accessing the even-numbered data in response to the start address.

In accordance with another aspect of the present invention, the first data accessing unit includes: a first transmission gate for outputting data on a first multiplexer even data output line under the control of the pisose signal; a second transmission gate for outputting data on a first multiplexer odd data output line under the control of the piseso signal; a third transmission gate for outputting data on a second multiplexer even data output line under the control of the pisose signal; and a fourth transmission gate for outputting data on a second multiplexer odd data output line under the control of the piseso signal, wherein output nodes of the first and the second transmission gates are connected to each other and output nodes of the third and the fourth transmission gates are attached to each other.

In accordance with another aspect of the present invention, the latch includes: a first plurality of inverters connected with the output node of the first transmission gate inversely and in parallel; and a second plurality of inverters connected with the output node of the third transmission gate inversely and in parallel.

In accordance with another aspect of the present invention, the second data accessing unit outputs data provided from the first plurality of inverters under the control of the pre-odd data output control signal and outputs data fed from the second plurality of inverters under the control of the post-odd data output control signal.

Therefore, by using circuits in accordance with the present invention, it is possible to substantially reduce the data accessing times at the pipelatch and the output driver in the semiconductor memory device.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a preferred embodiment of the present invention will be described in detail with reference to the accompanying drawings.

Figure 1:
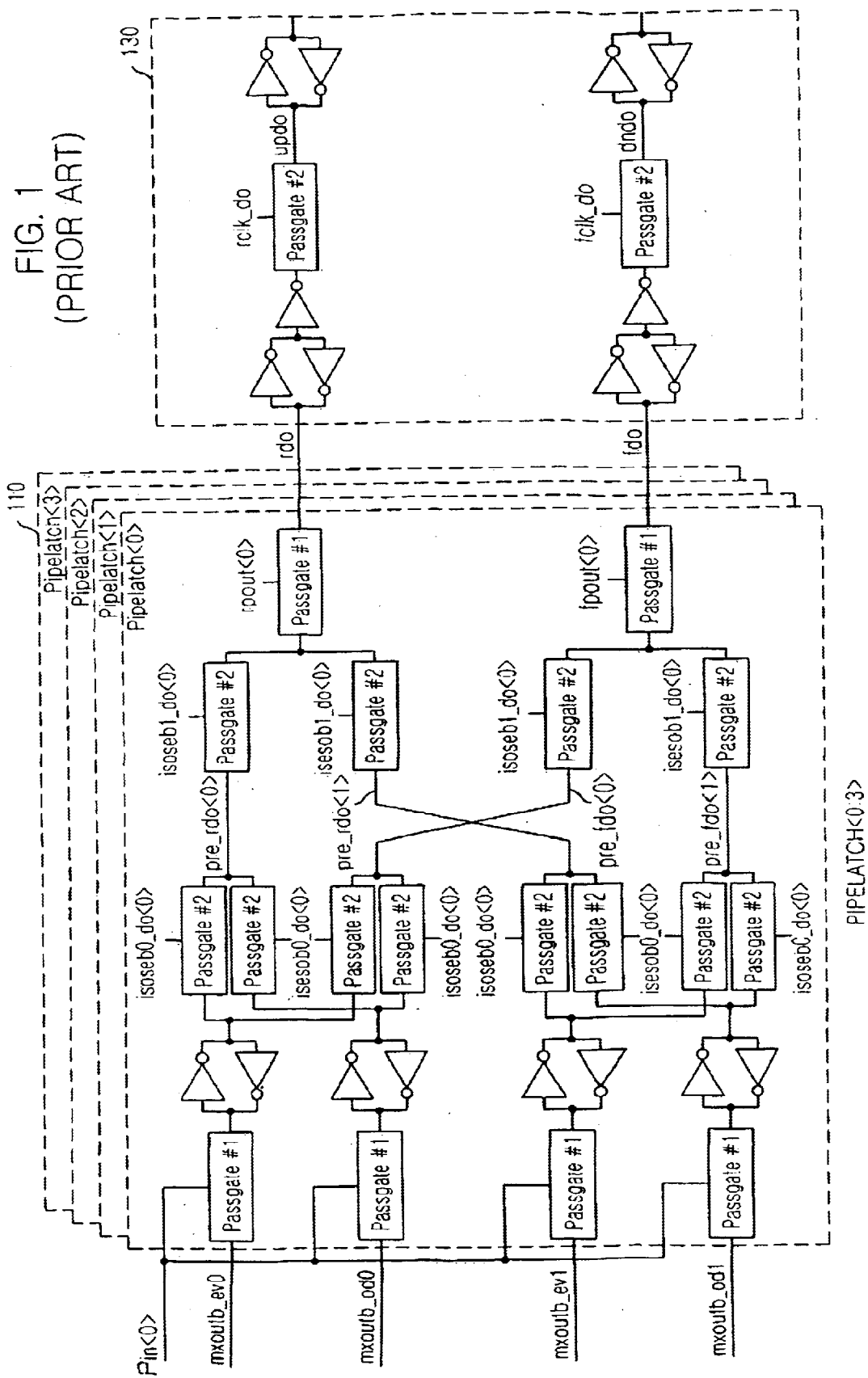
FIG. 1 shows a block diagram of a pipelatch unit and an output driver in a conventional semiconductor memory device.
Figure 2A:
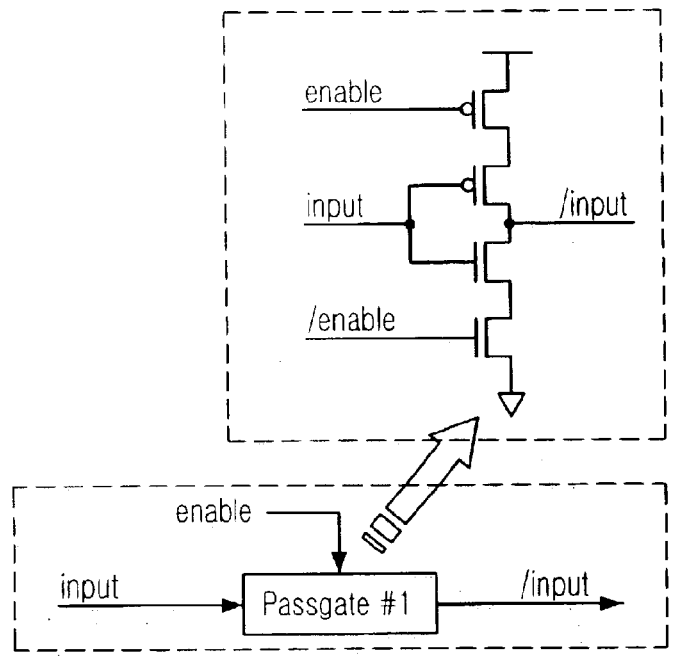
FIGS. 2A and 2B provide detailed circuit diagrams of a first-type and a second-type of a transmission gate shown in FIG. 1, respectively.
Figure 2B:
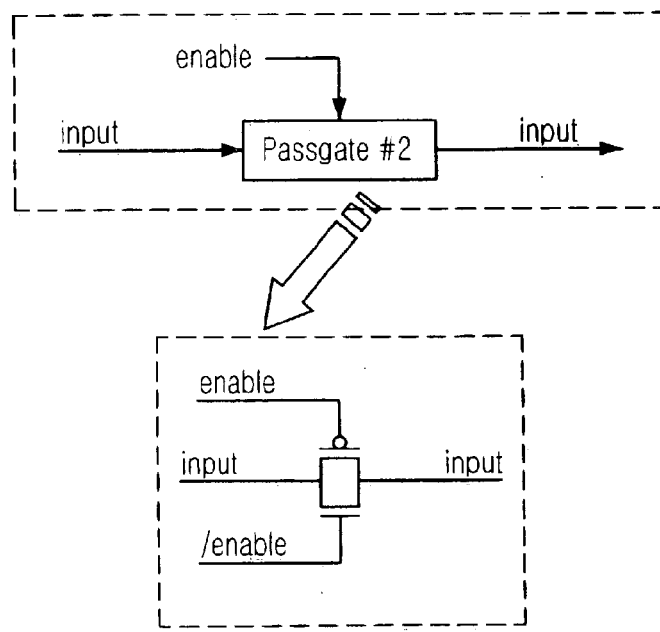
Figure 3:
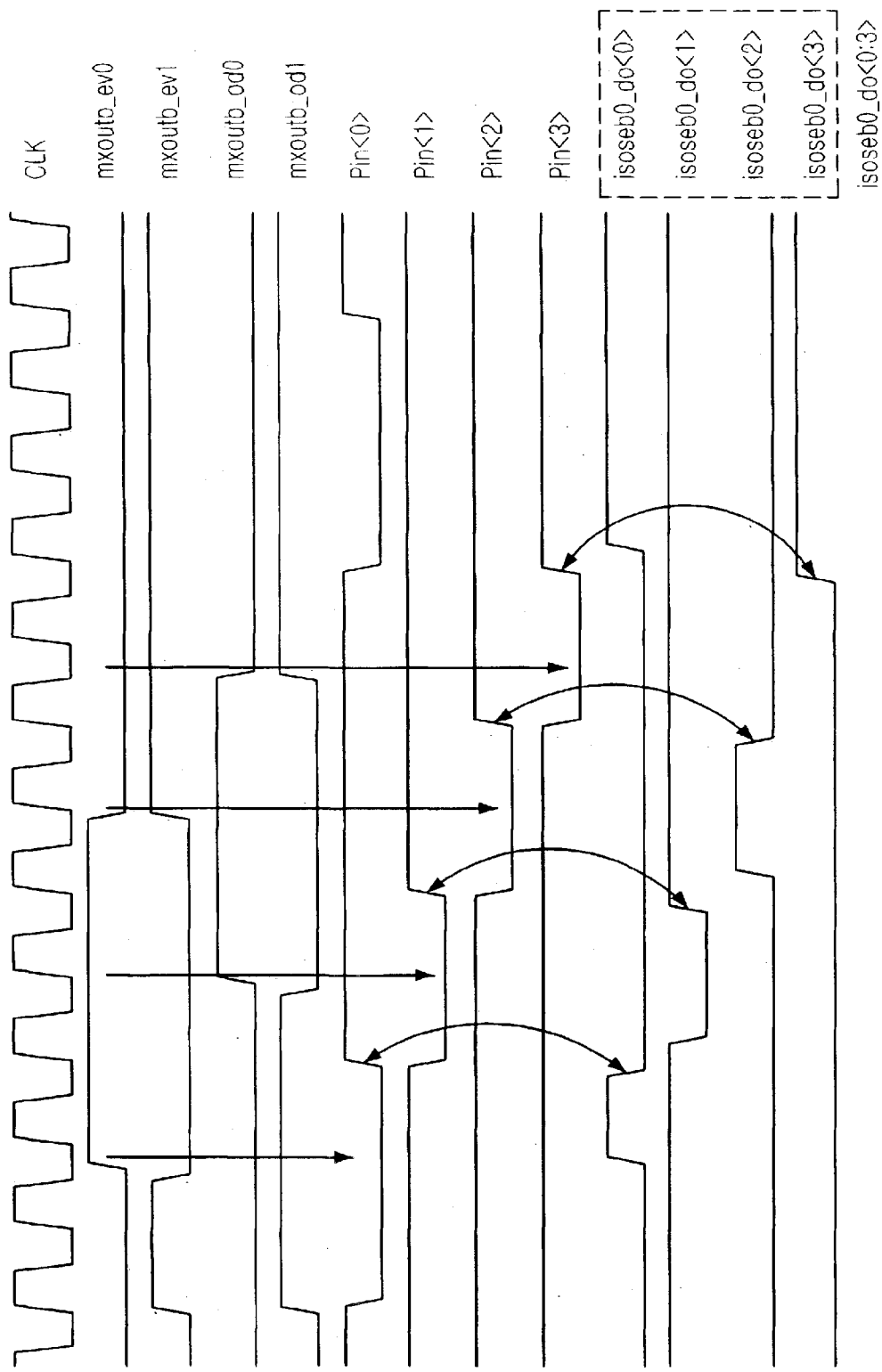
FIG. 3 is a waveform diagram showing simulation results at a first and a second accessing part in the pipelatch of FIG. 1.
Figure 4:
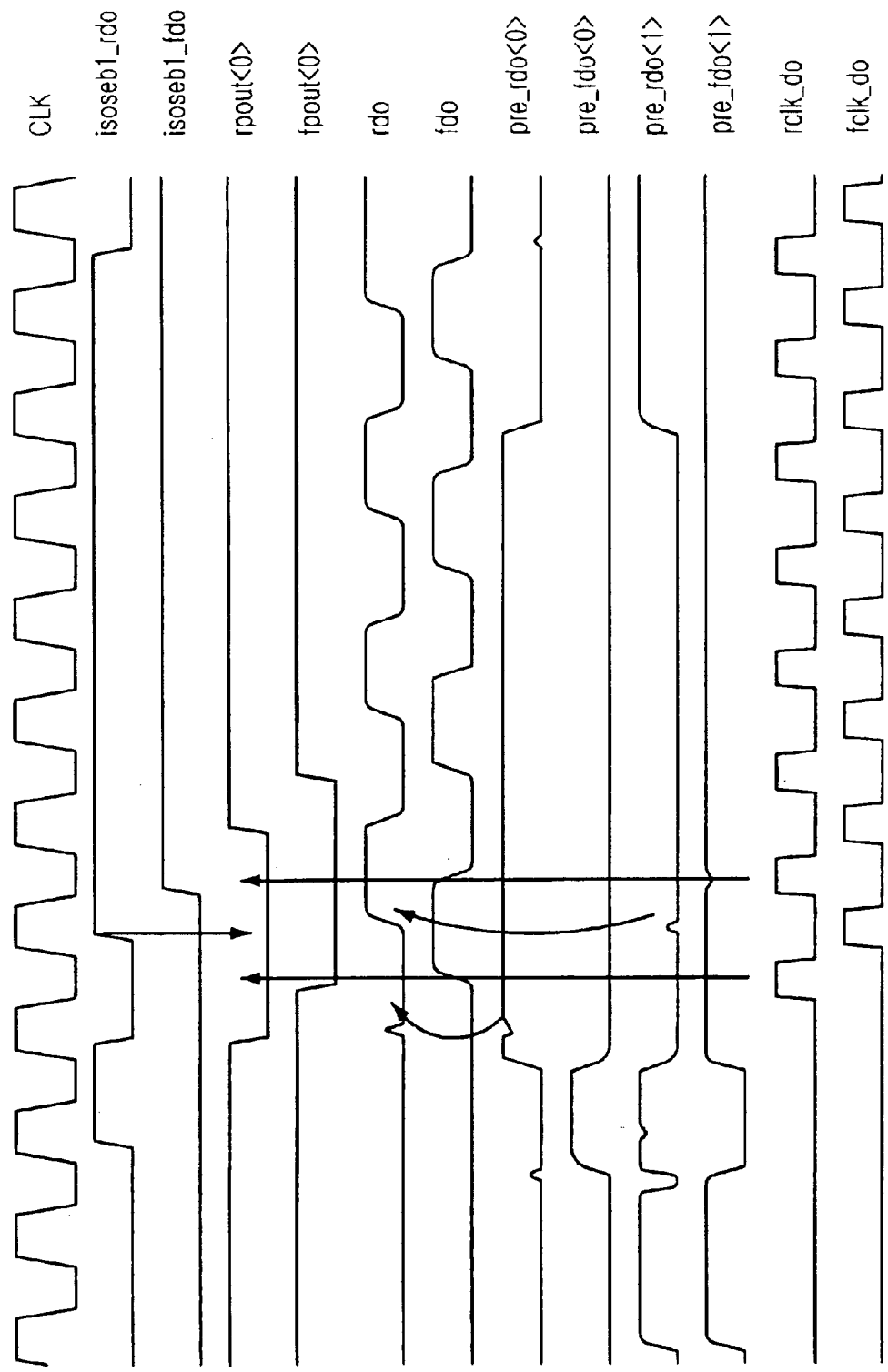
FIG. 4 is a waveform diagram representing simulation results at parts for the accessing of odd-numbered data in the pipelatch and the output driver of FIG. 1.
Figure 5:
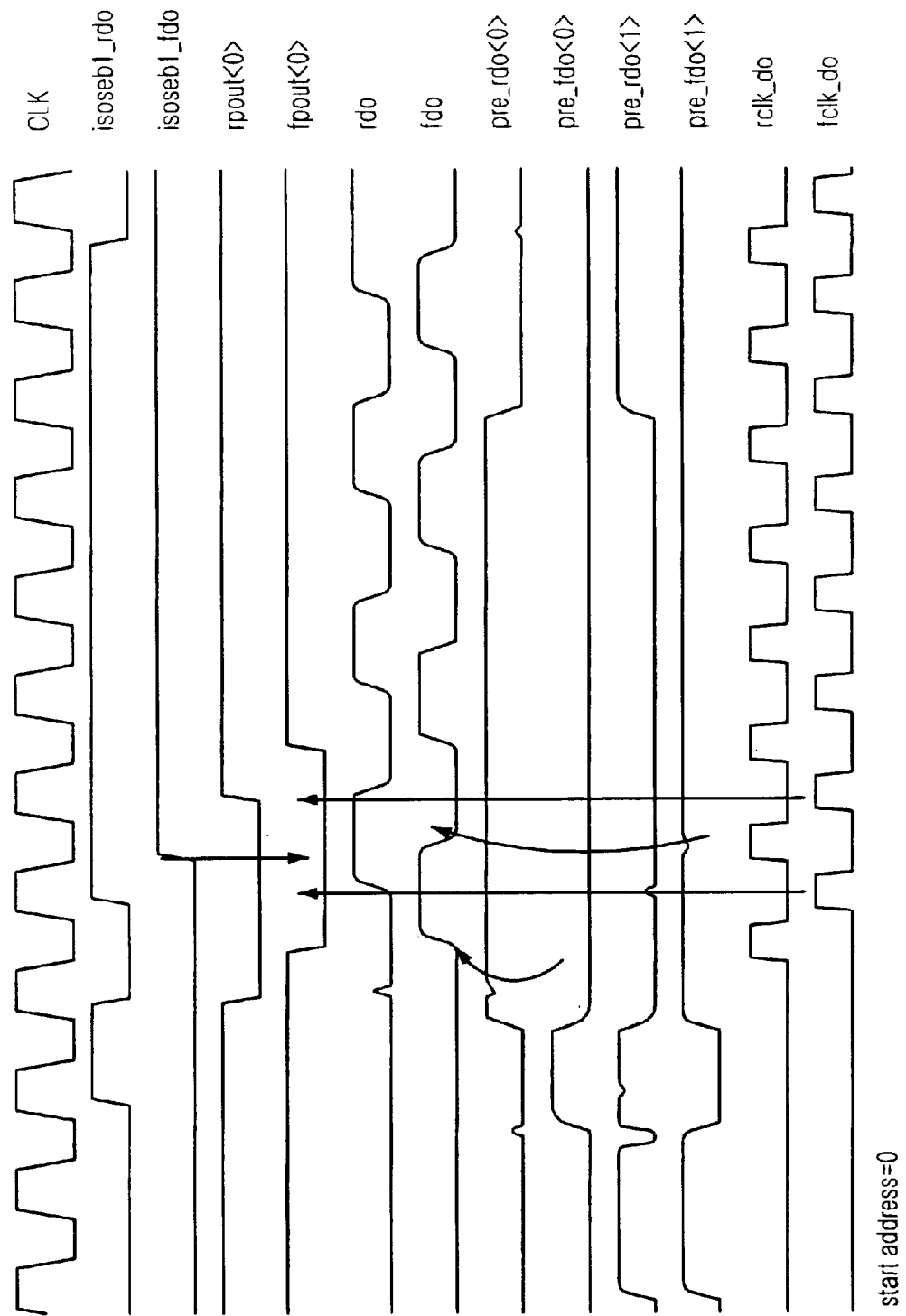
FIG. 5 is a waveform diagram representing simulation results at parts for the accessing of even-numbered data in the pipelatch and the output driver of FIG. 1.
Figure 6A:
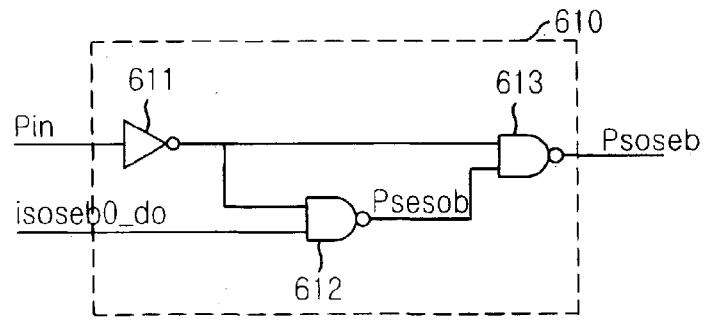
FIG. 6A describes a detailed circuit diagram of a first control signal generation unit in accordance with the present invention.
Figure 6B:
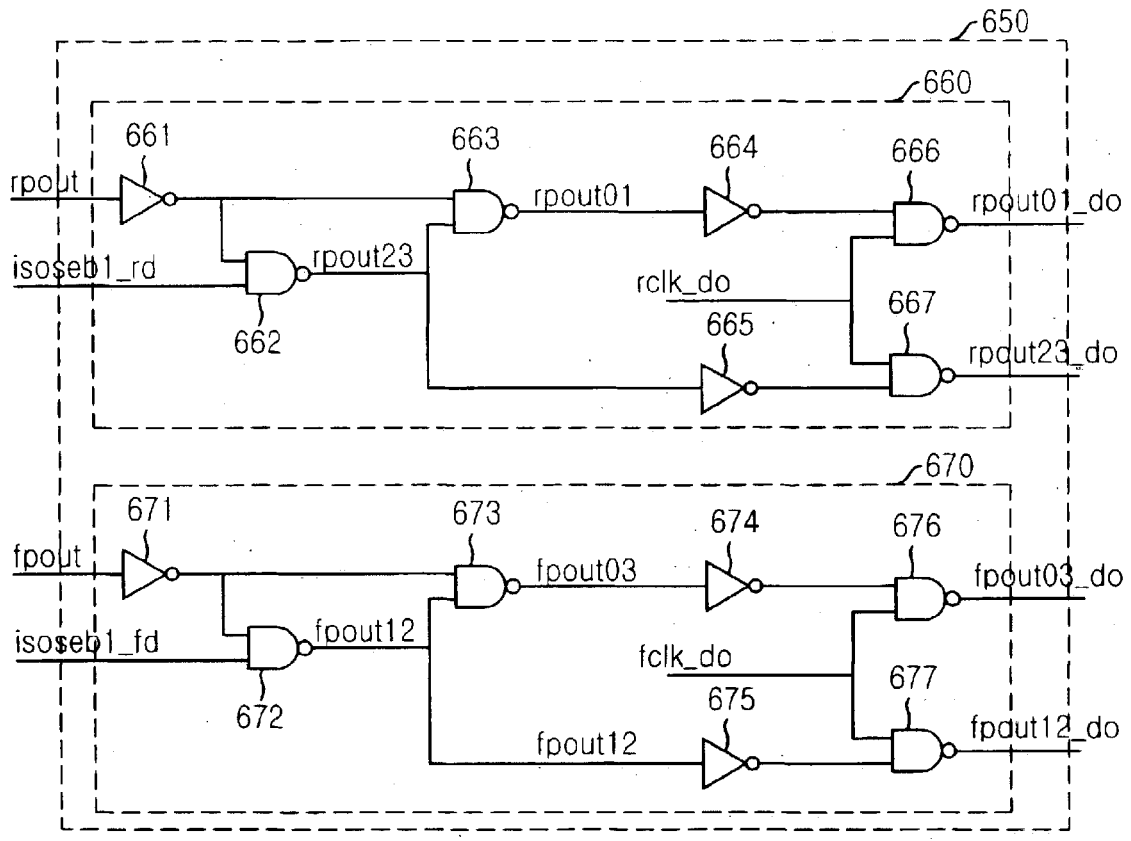
FIG. 6B shows a detailed circuit diagram of a second control signal generation unit in accordance with the present invention.

FIGS. 6A and 6B show detailed circuit diagrams of control signal generation units for producing control signals used in a piplatch in accordance with the present invention. That is, FIG. 6A describes a detailed circuit diagram of a first control signal generation unit and FIG. 6B represents a detailed circuit diagram of a second control signal generation unit.

The first control signal generation unit 610 includes an inverter 611 receiving a pipelatch-in signal, Pin, a NAND gate 612 receiving an output of the inverter 611 and a start-odd start-even data output control signal, isoseb0_do, to thereby output a piseso signal, Psesob, and a NAND gate 613 receiving the output of the inverter 611 and the piseso signal, Psesob, to thereby output a pisose signal, Psoseb.

Meanwhile, the second control signal generation unit 650 contains an odd data accessing control signal generation sector 660 and an even data accessing control signal generation sector 670.

The odd data accessing control signal generation sector 660 employs an inverter 661 coupled with an odd data enable signal, rpout, for outputting odd-numbered data, a NAND gate 662 receiving an output of the inverter 661 and a control signal, isoseb1_rd, for accessing the odd-numbered data in response to a start address, a NAND gate 663 receiving the output of the inverter 661 and an output of the NAND gate 662, an inverter 664 for inverting an output of the NAND gate 663, an inverter 665 for inverting the output of the NAND gate 662, a NAND gate 666 receiving an output of the inverter 664 and a rising edge synchronization signal, rclk_do, outputted synchronized with a rising edge of a clock pulse, and a NAND gate 667 receiving the rising edge synchronization signal, rclk_do, and an output of the inverter 665. As a result, a pre-odd data output control signal, rpout01_do, is outputted from the NAND gate 666 and a post-odd data output control signal, rpout23_do, is outputted from the NAND gate 667.

The even data accessing control signal generation sector 670 contains an inverter 671 coupled with an even data enable signal, fpout, for outputting even-numbered data, a NAND gate 672 receiving an output of the inverter 671 and a control signal, isoseb1_fd, for accessing the even-numbered data in response to the start address, a NAND gate 673 receiving the output of the inverter 671 and an output of the NAND gate 672, an inverter 674 for inverting an output of the NAND gate 673, an inverter 675 for inverting the output of the NAND gate 672, a NAND gate 676 receiving an output of the inverter 674 and a falling edge synchronization signal, fclk_do, outputted synchronized with a falling edge of the clock pulse, and a NAND gate 677 receiving the falling edge synchronization signal, fclk_do, and an output of the inverter 675. As a result, a pre-even data output control signal, fpout03_do, is outputted from the NAND gate 676 and a post-even data output control signal, fpout12_do is outputted from the NAND gate 677.

Figure 7:
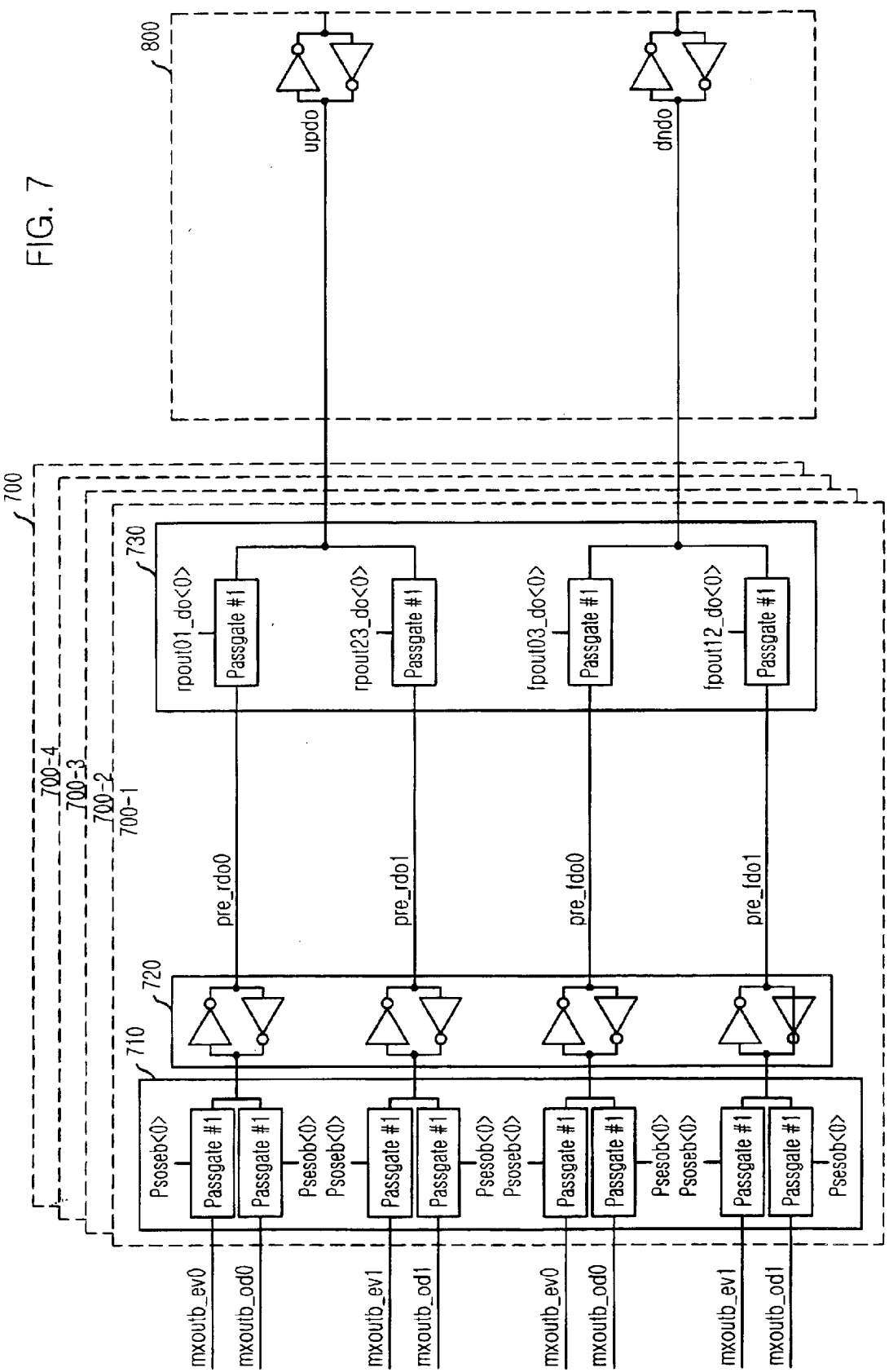
FIG. 7 depicts a block diagram of a pipelatch and an output driver in a semiconductor memory device in accordance with the present invention.

In FIG. 7, there is depicted a block diagram of a pipelatch and an output driver in a semiconductor memory device in accordance with the present invention.

A pipelatch 700 includes a first data accessing sector 710 for firstly accessing inputted data in response to the control signals, Psoseb and Psoseb, outputted from the first control signal generation unit 610 of FIG. 6A, a latch sector 720 for temporarily storing data outputted from the first data accessing unit 710, and a second data accessing sector 730 for secondly accessing and outputting the data stored at the latch sector 720 in response to the control signals, rpout01_do, rpout23_do, fpout03_do and fpout12_do, outputted from the second control signal generation unit 650 of FIG. 6B.

Hereinafter, the operation of the pipelatch 700 will be explained.

When the pisose signal, Psoseb, is in a "L" state, data on a first and a second even output line, mxoutb_ev0 and mxoutb_ev1, are transmitted onto a first and a second pre-rising edge output line, pre_rdo0 and pre_rdo1, and data on a first and a second odd output line, mxoutb_od0 and mxoutb_od1, are transmitted onto a first and a second pre-falling edge output line, pre_fdo0 and pre_fdo1.

Then, the data on the first and the second pre-rising edge output lines, pre_rdo0 and pre_rdo1, are sequentially outputted onto an upper input line, updo, of the output driver 800 in response to a pre-odd data output control signal, rpout01_do<0>, and a post-odd data output control signal, rpout23_do<0>, outputted from the second control signal generation unit 650 of FIG. 6B.

The data on the first and the second falling edge output lines, pre_fdo0 and pre_fdo1, are sequentially outputted onto a lower input line, dndo, of the output driver 800 in response to a pre-even data output control signal, fpout03_do<0>, and a post-even data output control signal, fpout12_do<0>, outputted from the second control signal generation unit 650 of FIG. 6B.

On the other hand, when the piseso signal, Psesob, is in a "L" state, the data on the first and the second odd output line, mxoutb_od0 and mxoutb_od1, are coupled onto the first and the second pre-rising edge output lines, pre_rdo0 and pre_rdo1, and the data on the first and the second even output lines, mxoutb_ev0 and mxoutb_ev1, are fed onto the first and the second pre-falling edge output lines, pre_fdo0 and pre_fdo1.

After then, the data on the first and the second pre-rising edge output lines, pre_rdo0 and pre_rdo1, are sequentially outputted onto the upper input line, updo, of the output driver 800 in response to the pre-odd data output control signal, rpout01_do<0>, and the post-odd data output control signal, rpout23_do<0>, outputted from the second control signal generation unit 650.

The data on the first and the second falling edge output lines, pre_fdo0 and pre_fdo1, are sequentially outputted onto the lower input line, dndo, of the output driver 800 in response to the pre-even data output control signal, fpout03_do<0>, and the post-even data output control signal, fpout12_do<0>, outputted from the second control signal generation unit 650.

Figures 8A, 8B:
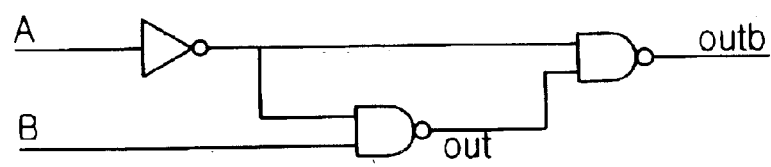
FIGS. 8A and 8B are a detailed circuit diagram and a logic state diagram of a circuit used in the first and the second control signal generation units in accordance with the present invention.

FIGS. 8A and 8B are a detailed circuit diagram and a logic state diagram of a circuit used in the first and the second control signal generation units in accordance with the present invention.

Since the skilled person in the art can analyze the circuit by using the circuit diagram and the state diagram described in FIGS. 8A and 8B, respectively, the detailed explanation for the circuit is omitted.

In accordance with the present invention, if the address access time decreases, it is possible to obtain a semiconductor memory device having a faster speed at a same CAS latency since tCKmin*CL=tAA. Herein, tAA is a one clock time and the CAS Latency, CL, means the number of clocks obtained from a clock time when a read instruction is inputted to a clock time when data are outputted. For instance, the semiconductor memory device having tAA=18 ns and CL=3 can operate at tCKmin=6 ns, i.e., 166 MHz. On the other hand, if tAA decreases to 14 ns, the semiconductor memory device can operate at tCKmin=4.66 ns, i.e., 214 MHz.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device capable of minimizing a data accessing time, comprising:

a first control signal generating means for outputting a first control signal generated by logically combining a pipelatch-in signal and a start-odd start-even data output control signal;

a second control signal generating means for outputting an odd control signal generated by logically combining an odd data enable signal for outputting odd-numbered data and a control signal for accessing the odd-numbered data in response to a start address, and outputting an even control signal produced by logically combining an even data enable signal for outputting even-numbered data and a control signal for accessing the even-numbered data in response to the start address;

a first data accessing means for accessing inputted data under the control of the first control signal outputted from the first control signal generating means;

a latching means for temporarily storing data outputted from the first data accessing means; and a second data accessing means for secondly accessing the data stored at the latching means and outputting secondly accessed data.

2. The semiconductor memory device of claim 1, wherein the first control signal generating means includes:

an inverter receiving the pipelatch-in signal;

a first NAND gate receiving an output of the inverter and the start-odd start-even data output control signal to thereby output a piseso signal; and a second NAND gate receiving the output of the inverter and an output of the first NAND gate to thereby output a pisose signal.

3. The semiconductor memory device of claim 2, wherein the second control signal generating means includes:

an odd data accessing control signal producing means for outputting the odd control signal generated by logically combining the odd data enable signal for outputting the odd-numbered data and the control signal for accessing the odd-numbered data in response to the start address; and an even data accessing control signal producing means for outputting the even control signal created by logically combining the even data enable signal for outputting the even-numbered data and the control signal for accessing the even-numbered data in response to the start address.

4. The semiconductor memory device of claim 3, wherein the odd data accessing control signal producing means has:

a first inverter receiving the odd data enable signal for outputting the odd-numbered data;

a first NAND gate receiving an output of the first inverter and the control signal for accessing the odd-numbered data in response to the start address;

a second NAND gate receiving the output of the first inverter and an output of the first NAND gate;

a second inverter for inverting an output of the second NAND gate;

a third inverter for inverting the output of the first NAND gate;

a third NAND gate receiving an output of the second inverter and a rising edge synchronization signal outputted synchronized with a rising edge of a clock pulse to thereby output a pre-odd data output control signal; and a fourth NAND gate receiving the rising edge synchronization signal and an output of the third inverter to thereby output a post-odd data output control signal.

5. The semiconductor memory device of claim 3, wherein the even data accessing control signal producing means has:

a first inverter receiving the even data enable signal for outputting the even-numbered data;

a first NAND gate receiving an output of the first inverter and the control signal for accessing the even-numbered data in response to the start address;

a second NAND gate receiving the output of the first inverter and an output of the first NAND gate;

a second inverter for inverting an output of the second NAND gate;

a third inverter for inverting the output of the first NAND gate;

a third NAND gate receiving an output of the second inverter and a falling edge synchronization signal outputted synchronized with a falling edge of a clock pulse to thereby output a pre-even data output control signal; and a fourth NAND gate receiving the falling edge synchronization signal and an output of the third inverter to thereby output a post-even data output control signal.

6. The semiconductor memory device of claim 5, wherein the first data accessing means includes:

a first transmission gate for outputting data on a first multiplexer even data output line under the control of the pisose signal;

a second transmission gate for outputting data on a first multiplexer odd data output line under the control of the piseso signal;

a third transmission gate for outputting data on a second multiplexer even data output line under the control of the pisose signal; and a fourth transmission gate for outputting data on a second multiplexer odd data output line under the control of the piseso signal, wherein output nodes of the first and the second transmission gates are connected to each other and output nodes of the third and the fourth transmission gates are attached to each other.

7. The semiconductor memory device of claim 6, wherein the latching means includes:

a first plurality of inverters connected with the output node of the first transmission gate inversely and in parallel; and a second plurality of inverters connected with the output node of the third transmission gate inversely and in parallel.

8. The semiconductor memory device of claim 7, wherein the second data accessing means outputs data provided from the first plurality of inverters under the control of the pre-odd data output control signal and outputs data fed from the second plurality of inverters under the control of the post-odd data output control signal.

* * * * *